United States Patent
Chiu et al.

[19]

[11] Patent Number: 5,901,079
[45] Date of Patent: May 4, 1999

[54] SKEWED MEMORY CELL APPARATUS AND METHOD

[75] Inventors: Tom Tien-Cheng Chiu; Donald George Mikan, Jr., both of Austin; Jeffrey Tuan Nguyen, Round Rock, all of Tex.

[73] Assignee: International Business Machines Corporation, Armonk, N.Y.

[21] Appl. No.: 08/782,723

[22] Filed: Jan. 13, 1997

[51] Int. Cl.$^6$ ...................................................... G11C 8/00
[52] U.S. Cl. .................... 365/154; 365/233; 365/230.05; 365/156
[58] Field of Search ................................... 365/154–156, 365/189.04, 230.05, 233

[56] References Cited

U.S. PATENT DOCUMENTS

| | | | |
|---|---|---|---|
| 4,571,709 | 2/1986 | Skupnjak et al. | 365/233 |
| 4,799,194 | 1/1989 | Arakawa | 365/154 |
| 5,007,022 | 4/1991 | Leigh | 365/189.04 |
| 5,065,363 | 11/1991 | Sato | 365/154 |
| 5,388,249 | 2/1995 | Hotta et al. | 395/550 |
| 5,509,134 | 4/1996 | Fandrich | 365/185.33 |
| 5,590,087 | 12/1996 | Chung | 365/49 |

Primary Examiner—A. Zarabian
Attorney, Agent, or Firm—Anthony V.S. England; Kermit D. Lopez; Andrew J. Dillon

[57] ABSTRACT

An improved random-access memory apparatus and method for rapidly reading and writing high-level logic data to and fiom the random-access memory apparatus during phase-driven timing cycles. The improved random-access memory apparatus includes an unbalanced storage circuit for the evanescent storage of binary data, and includes two opposing logic inverters coupled together such that high level logic data can be rapidly written to the unbalanced storage circuit during a write cycle. A first logic inverter is sized larger than a second logic inverter. In addition, the improved random-access memory apparatus includes a circuit for reading and writing binary data to and from the unbalanced storage circuit. The circuit for reading and writing binary data to and from the unbalanced storage circuit operates in a cycle which includes clock phases carried on a phase line to the circuit for reading and writing binary data to and from the unbalanced storage circuit. The first logic inverter included within the unbalanced storage circuit is preferably a high-performance type of logic inverter type and the second logic inverter is preferably of a type weak in its ability to drive a binary logic signal. The unbalanced storage circuit preferably operates in a cycle which includes four clock phases carried on the phase line to the circuit for reading and writing binary data to and from the unbalanced storage circuit.

21 Claims, 6 Drawing Sheets

SKEWED MEMORY CELL APPARATUS AND METHOD

BACKGROUND OF THE INVENTION

1. Technical Field

The present invention relates, in general, to integrated circuit technology and, in particular, to the design of very large-scale integrated circuits. More particularly the present invention relates to the design of fast dynamic logic circuits. Still more particularly, the present invention relates to domino logic circuitry and to random-access memory circuit designs having memory cells that are undisturbed during cell-access time periods.

2. Description of the Related Art

Dynamic logic cells which are maintained in integrated circuits in a space-efficient and wireable fashion, and which are undisturbed during certain cell-access time periods is a goal sought by designers of very large-scale integrated circuits. In the design of integrated circuits utilizing dynamic logic cells, particularly register memory arrays, it is highly desirable to employ circuits having a minimal number of active devices per stage. This reduces the cost of dynamic logic circuits, when realized in integrated-circuit form, and results in higher packing density in view of the reduced area occupied per stage. It is also highly desirable to promote faster read and write operations for dynamic logic cells utilized in random-access memory designs. This reduces delay in processing which, in turn, increases performance.

It is well-known that complex logic functions can be implemented with shorter latency and smaller layout area by using dynamic logic rather than static logic. A wellknown example of a technique utilizing dynamic logic is "DOMINO" (hereinafter referred to as "domino"). This technique employs clocked transistors for precharging, a pull-down network having signal inputs, a clock input for discharging, and an inverter for buffering inverting an output signal. Due to the inversion of the output signal, it is possible to feed the output of such a domino logic circuit to the input of another domino logic circuit, and multiple logic levels can be connected for computation during the same evaluation clock phase.

Domino logic circuits use MOS (metal oxide silicon) transistors in their evaluation networks, resulting in a small layout available for design. Domino logic circuits are principally utilized for the implementation of non-inverting logic functions reduced to a combination of AND, OR, OR/AND or AND/OR gates. An advantage of domino logic is that it can be used to implement multiple levels of logic during a single evaluation clock phase very quickly, while still maintaining an acceptable noise immunity on intermediate nodes. This is partly due to the use of inverters between logic stages.

Random-access memory designs typically utilize MOS structures in conjunction with dynamic logic cells. Random-access memory is semiconductor-based memory that can be read and written by a microprocessor or other hardware devices. The storage locations in a random-access memory can be accessed in any order. Dynamic randomaccess memory can have as few as one integrated transistor and one capacitor component. Thus, a large number of random-access memory cells can be fabricated in a small wafer area. However, because dynamic random-access memory is volatile, the stored charge on the capacitor is required to be periodically refreshed, thereby requiring, in many instances, refresh circuitry. On the other hand, the memory-refresh requirements may be left to the programmer of the microcomputer to assure that all cells have been accessed in a prescribed period of time. Random-access memory at the chip level can be classified as memory having an access time independent of the physical location of data. This is contrasted with serial-access memories, which have some latency associated with the reading or writing of a particular datum, and with content-addressable memories.

In high-speed microcomputer applications which are computationally intensive, a large amount of on-chip memory is required. "Cycle-scaling" techniques commonly employed by programmers for memory-refresh purposes are thus limited. Also, dynamic random access memories are not easily integrated with microcomputers requiring read and write operations of different addresses within a single machine cycle. A four-phase microcomputer clocking system typically allows little or no time to refresh memory, so that the burden is placed on the programmer to ensure that an entire memory array included within a random-access memory chip is refreshed. In real-time applications, this constraint is highly undesirable. An unbalanced memory cell which includes transistors of varying size and type can assist in avoiding such "refreshment" by speeding write and read-time periods. However, this also contributes to an increase in read and write error conditions.

From the foregoing, it can be seen that a need exists for an improved memory array having dynamic-type cells adapted for high-density fabrication, and in which unbalanced static memory cells create a faster write into a register while eliminating error conditions commonly found in such unbalanced static memory cells. A need further exists to effectively write data into register cells in as short a time period as possible. A need also exists to incorporate such faster static memory cells into domino logic circuitry, while reducing errors associated with unbalanced static memory cells.

SUMMARY OF THE INVENTION

It is therefore an object of the present invention to provide for an improved integrated-circuit technology.

It is another object of the present invention to provide an improved integratedcircuit technology for the design of very large-scale integrated circuits.

It is still another object of the present invention to provide for improved dynamic logic circuits utilized in integrated circuits in a space-efficient and wireable fashion.

It is yet another object of the present invention to provide for improved domino logic circuitry and random-access memory cell designs which are undisturbed during cellaccess time periods.

The above and other objects are achieved as is now described. An improved random-access memory apparatus and method is provided for rapidly reading and writing high-level logic data to the random-access memory apparatus during phasedriven timing cycles. The improved random-access memory apparatus includes an unbalanced storage circuit for the evanescent storage of binary data, and includes two opposing logic inverters coupled together such that high level logic data can be rapidly written to the unbalanced storage circuit during a write cycle. A first logic inverter is sized larger than a second logic inverter. In addition, the improved random-access memory apparatus includes a circuit for reading and writing binary data to and from the unbalanced storage circuit. The circuit for reading and writing binary data to and from the unbalanced storage circuit operates in a cycle which includes clock phases carried on a phase line to the circuit for reading and writing binary data to and from the unbalanced storage circuit. The first logic inverter included within the unbalanced storage circuit is preferably a highperformance type of logic inverter type, and the second logic inverter is preferably of a type weak in its ability to drive a binary logic signal. The unbalanced storage circuit preferably operates in a cycle which includes four clock phases carried on the phase line to the circuit for reading and writing binary data to and from the unbalanced storage circuit.

BRIEF DESCRIPTION OF THE DRAWINGS

The novel features believed characteristic of the invention are set forth in the appended claims. The invention itself, however, as well as a preferred mode of use, futher objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
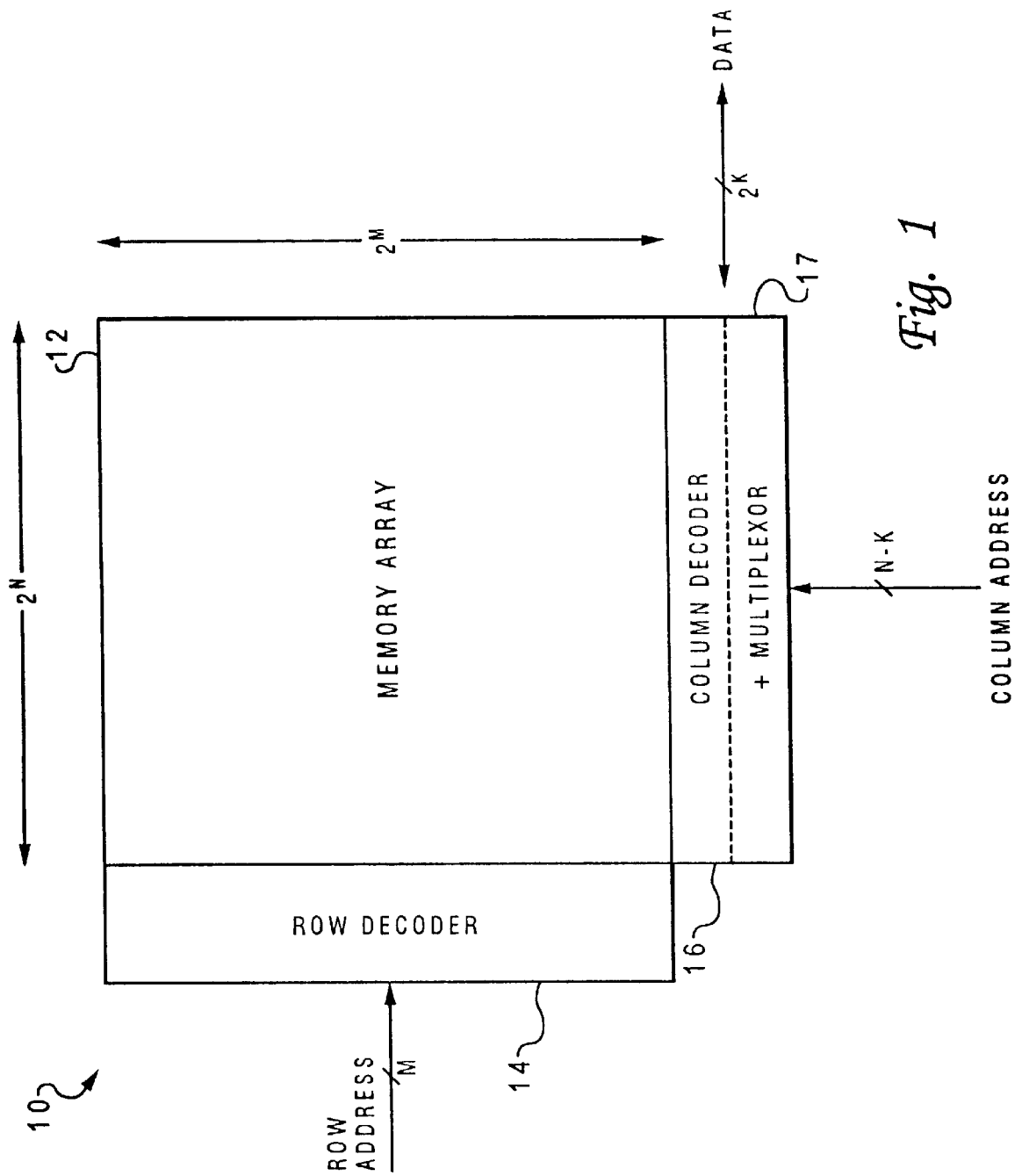
FIG. 1 is a schematic diagram of a random-access memory chip architecture which can be utilized in accordance with the apparatus and method of the present invention.

With reference now to the figures and in particular with reference to FIG. 1, a schematic diagram of a random-access memory chip architecture 10 which can be utilized in accordance with the present invention is depicted. Central to the design of randomaccess memory chip architecture 10 is a memory array 12 having $2^m$ by $2^m$ bits of storage. A row (or word) decoder 14 addresses one word of $2^m$ bits out of $2^m$ words. The column (or bit) decoder 16 addresses $2^k$ of $2^m$ bits of the accessed row. Column decoder 16 accesses a multiplexer 17, which routes addressed data to and from interfaces to the external world.

Figure 2:
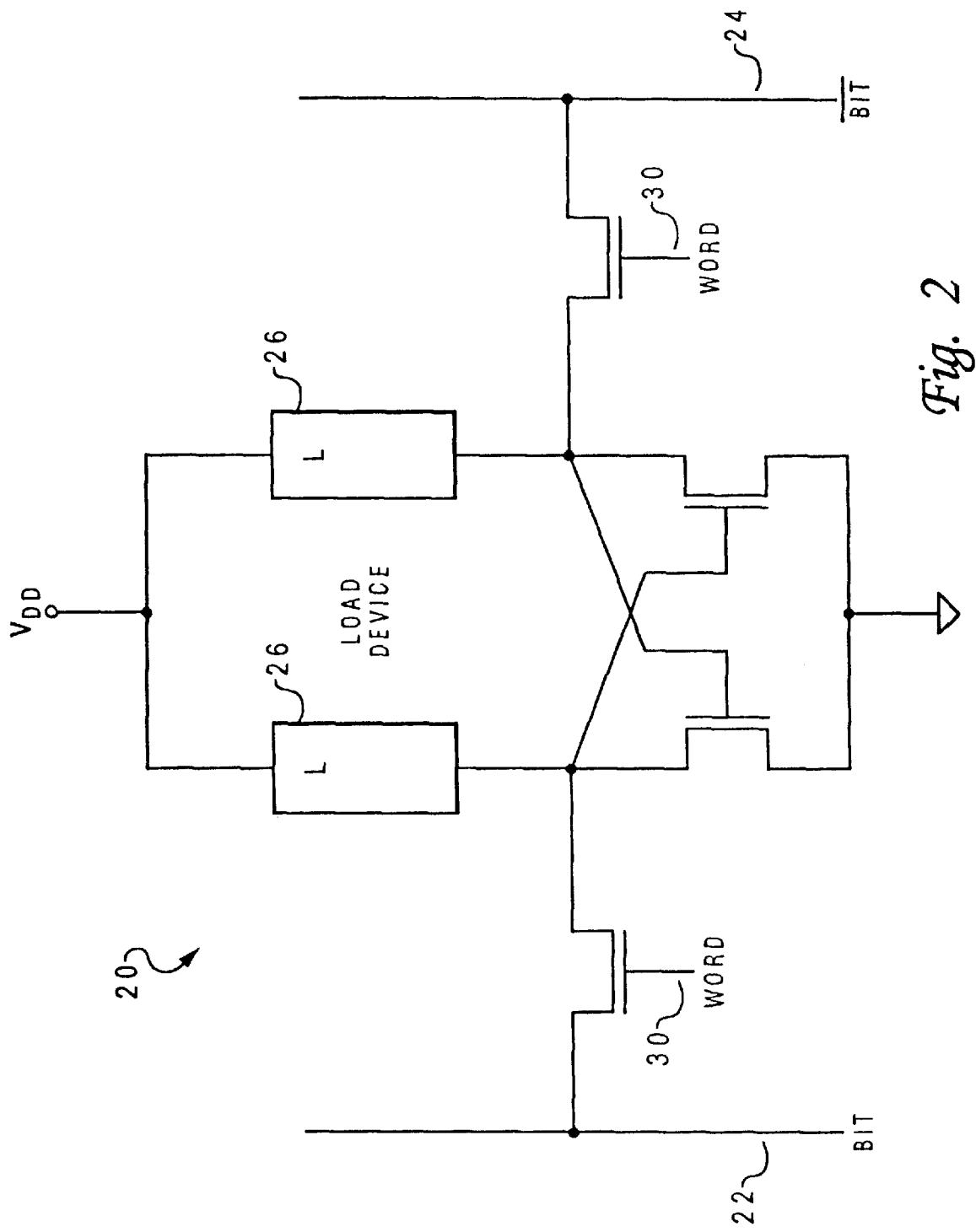
FIG. 2 is a schematic diagram illustrative of a prior-art random-access memory cell.

FIG. 2 is a schematic diagram illustrative of a prior-art random-access memory cell 20. Random-access memory cell 20 includes a cross-coupled inverter circuit 21 connected by pass transistors 32 to bit line 22 and bit line 24. Load 26 may be a depletion or enhancement transistor, a p-transistor, or an undoped polysilicon resistor. Load 26 functions to counteract the effect of charge leakage at the drains of the pulldown and pass transistors. To successfully write data to random-access memory cell 20, data is placed on bit line 22 and bit line 24. Word line 30 is then asserted. A read operation commences by precharging bit line 22 and bit line 24. Word line 30 is asserted and either bit line 22 or bit line 24 will be discharged by one of the pull-down transistors 33 or 34 of random-access memory cell 20.

Figure 3A:
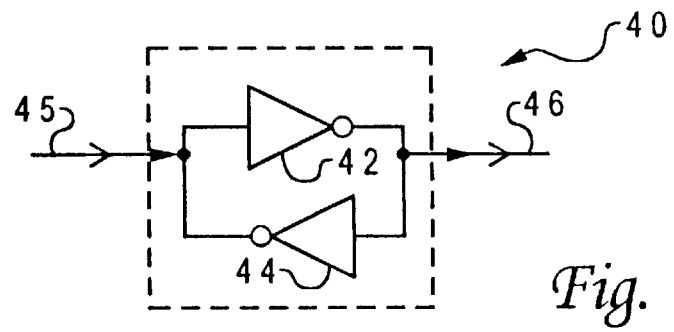
FIG. 3(a) depicts a schematic diagram of a skewed and unbalanced random-access memory cell which can be utilized in accordance with the apparatus and method of the present invention.

FIG. 3(a) depicts a schematic diagram of a skewed random-access memory cell 40 which can be utilized in accordance with the apparatus and method of the present invention. Skewed random-access memory cell 40 can be utilized with a random access chip architecture similar to the random access chip architecture illustrated in FIG. 1. Unlike the cross-coupled inverter circuit configuration depicted in FIG. 2, skewed random-access memory cell 40 illustrates a register memory cell configuration having opposing and unbalanced (i.e., "skewed") logic inverters: logic inverter 42 and logic inverter 44. The logic inverters are unbalanced because one logic inverter is sized greater than the other logic inverter. Logic inverter 42 is preferably sized larger than logic inverter 44 such that logic inverter 42 handles a larger current than logic inverter 44. The output of logic inverter 44 is coupled to the input of logic inverter 42. The output of logic inverter 42 is coupled to the input of logic inverter 44. An input 45 to randomaccess memory cell 40 is coupled to the input of logic inverter 42 and the output of logic inverter 44. An output 46 of random-access memory cell 40 is coupled to the input of logic inverter 44 and the output of inverter 42. Thus, logic inverters 42 and 44 finction to invert binary signals. Skewed random-access memory cell 40 is one form of an unbalanced storage circuit for the evanescent storage of binary data.

Figure 3B:
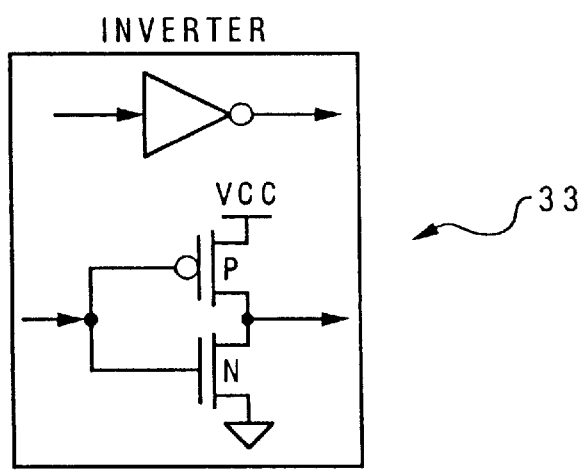
FIG. 3(b) illustrates transistor schematic and schematic icon forms for inverter logic circuits which can be utilized in accordance with the apparatus and method of the present invention.
Figure 3B:
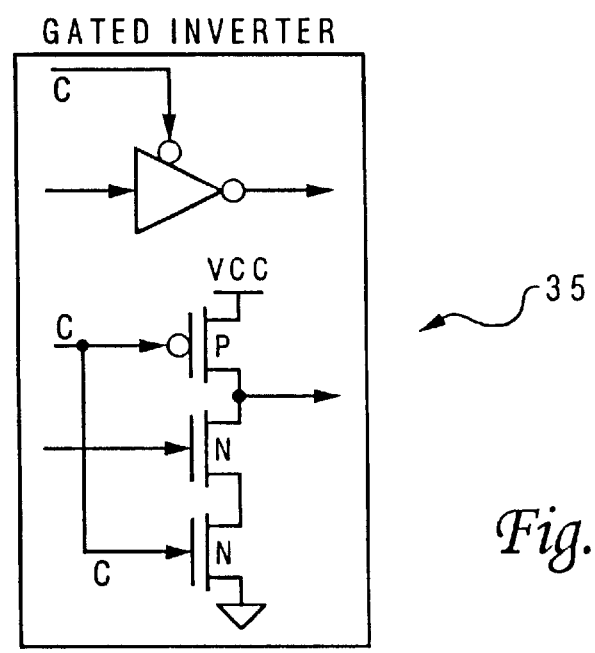

FIG. 3(b) illustrates transistor schematic and schematic icon forms for inverter logic circuits which can be utilized in accordance with the apparatus and method of the present invention. As depicted at block 33, a symbolic logic inverter can be composed of a P-type transistor and N-type transistor. As depicted at block 35, a symbolic gated logic inverter is preferably composed of two N-type transistors whose gates are coupled to the gate of a P-type transistor. Such logic inverters are commercially available and can be utilized in conjunction with the invention described herein. A gated logic inverter typically includes a logic signal input provided at a gate of one of the N-type transistors and a clock signal input provided at the gate of the P-type transistor. Thus, a gated logic inverter such as the one depicted at block 35 allows for the provision of a clock signal input to the gated logic inverter.

Figure 4A:
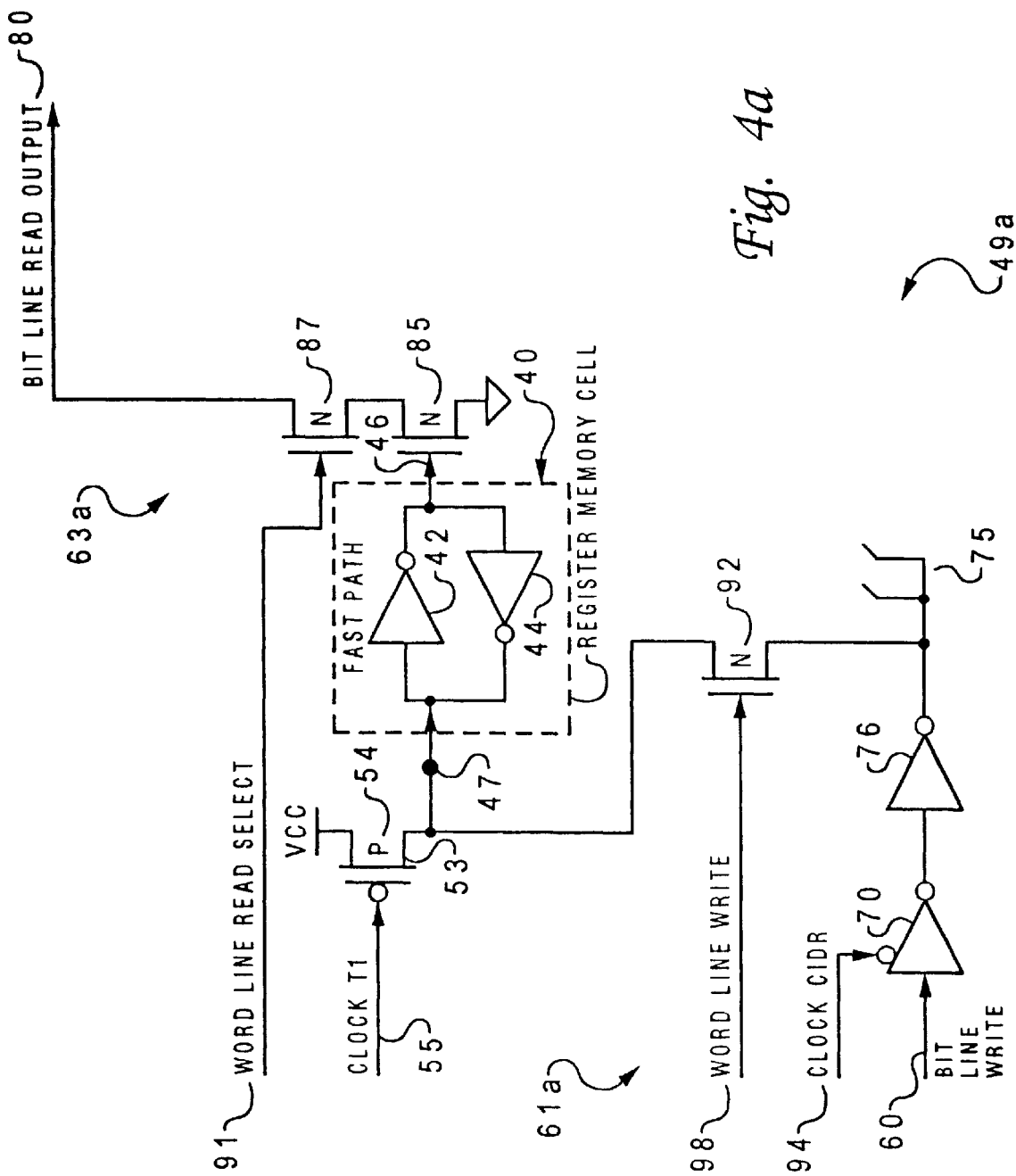
FIG. 4(a) depicts a schematic diagram of a random-access memory circuit which can be utilized in accordance with the apparatus and method of the present invention.
Figure 4B:
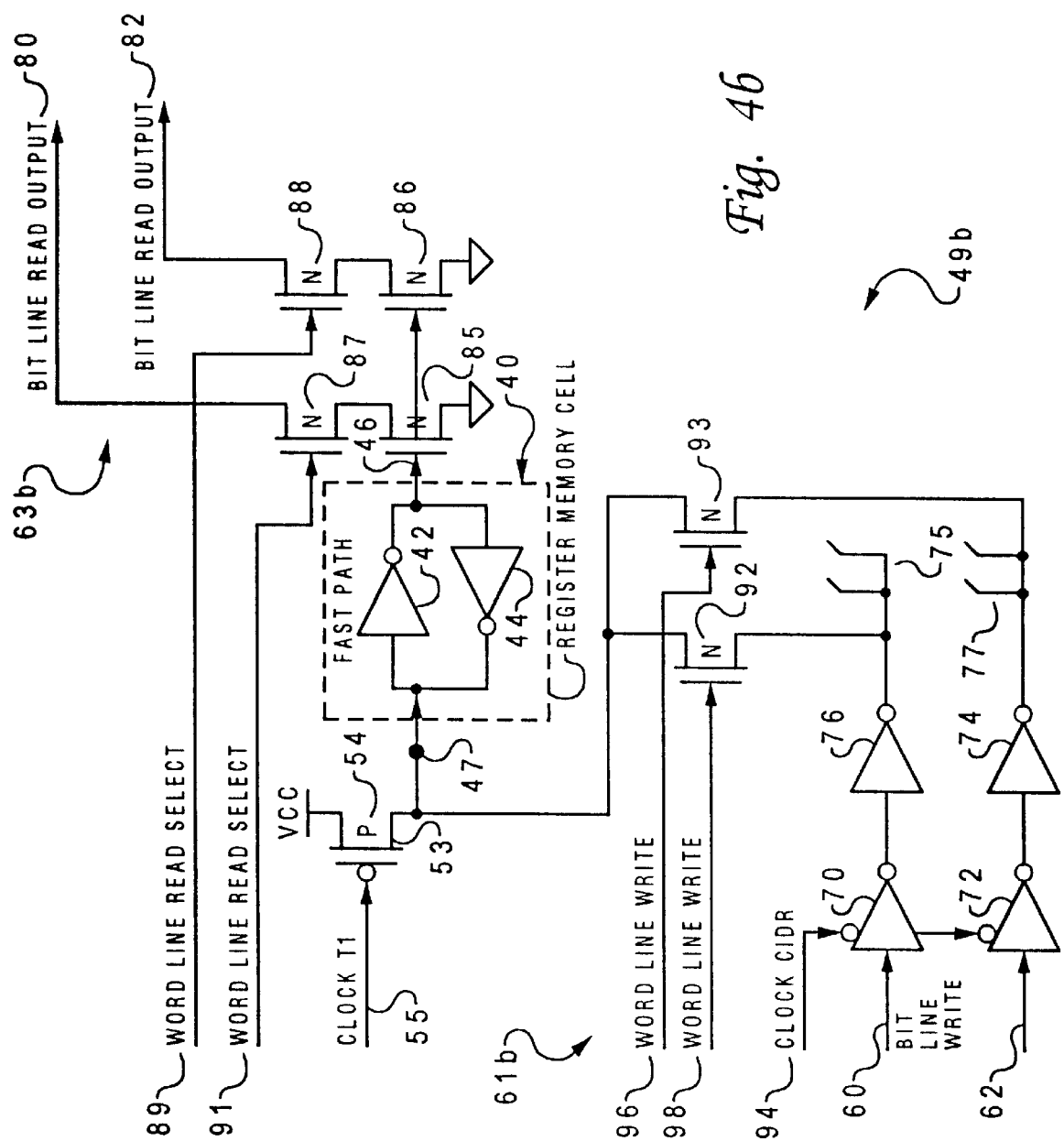
FIG. 4(b) depicts a schematic diagram of a random-access memory circuit with multiple read/write ports which can be utilized in accordance with the apparatus and method of the present invention.

In FIG. 4(a) and FIG. 4(b), like parts are indicated by like numbers. FIG. 4(a) depicts a schematic diagram of a random-access memory circuit 49a which can be utilized in accordance with the apparatus and method of the present invention. Random-access memory circuit includes a skewed random-access memory cell 40 analogous to that depicted in FIG. 3(a), and write and read circuitry which enable data to be written and read fiom skewed random-access memory cell 40. It is to be understood that, in practice, random-access memory cell 40 can be utilized with other similar cells arranged in rows and columns for accessing selected cells during read and write operations. In addition, a memory embodying a number of such cells would include conventional address decode circuits, clocking circuits, sense amplifier circuits, data and address buffers, and a number of other circuits (all now shown) which would be required to support memory operations. Also, the invention can be advantageously embodied as onchip memory with a microcomputer or integrated into a memory chip by itself. Skewed random-access memory cell 40 is thus a storage register capable of storing binary data, and which functions as a small region of high-speed memory for random-access memory circuit 49a. Skewed random-access memory cell 40 is thus one form of a register memory cell for the evanescent storage of binary data.

Random-access memory circuit 49a is preferably implemented on an integrated-circuit chip which utilizes a four-phase clocking system. The four-phase clocking system includes the following time periods: T1, T2, T3 and T4. Time period T1 is the first 25%, time period, T2 is the second 25%, etc. In the schematic diagram of FIG. 4(a), a clock input 55, labeled "T1_Cond_Clr" is coupled to the gate of P-type transistor 54 whose drain terminal 53 is connected to skewed random-access memory cell 40 and write circuit 61 at node 47. Clock input 55 is preferably provided by a system clock gated such that a clear signal may be asserted during the T1 clock phase. Although the present invention describes the use of a four-phase clock cycle, such a timing cycle is not a necessary limitation of the present invention. One skilled in the art will realize that variations on the four-phase clock cycle can also be utilized in conjunction with the present invention.

P-type transistor 54 is a clocked transistor utilized for precharging skewed randomaccess memory cell 40 to a precharge voltage level. A bit-line write input 60 is provided at gated logic inverter 70 which, in turn, is coupled to the input of logic inverter 76. The output of inverter 76 is coupled to the drain of N-type transistor 76. The source of N-type transistor 92 is connected to the drain of P-type transistor 54 at node 47. A word-line write input 98 is provided at the gate of N-type transistor 92 such that gated logic inverter 70, logic inverter 76 and N-type transistor 92 constitute write circuit 61a. Gated logic inverter 70 is also coupled to a reset delay clock 94 labeled "Clock CIDR." At node 75, multiple lines can be optionally connected to enable external word operations. Output 46 of skewed random-access memory cell 40 is coupled to the gate of N-type transistor 85 whose drain is tied to ground and whose source is tied to the drain of N-type transistor 87. Word-line read-select input 91 is provided at the gate of N-type transistor 87. The source of N-type transistor 87 provides bit-read output data at line 80. N-type transistors 87 and 85 constitute read circuit 63a. Write circuit 61a and read circuit 63a together function as one form of a circuit which reads and writes binary data to and from an unbalanced storage circuit for the evanescent storage of binary data.

FIG. 4(b) depicts a schematic diagram of a random-access memory circuit 49b which can be utilized in accordance with the apparatus and method of the present invention. Read and write circuits which support random-access memory circuit 49b have multiple data read and write inputs. In the example of FIG. 4(b), 2 bits can be written and read from random-access memory circuit 49b as opposed to the one bit configuration of FIG. 4(b). The aforementioned clocking arrangement (i.e., T1, T2, etc.) is utilized in conjunction with the configuration illustrated in FIG. 4(b).

P-type transistor 54 is a clocked transistor utilized for precharging skewed randomaccess memory cell 40. Bit-line write inputs 60 and 62 are provided respectively at logical signal inputs to gated logic inverters 70 and 72. Gated logic inverters 70 and 72 are respectively tied to the inputs of logic inverters 76 and 74. The output of logic inverter 76 is coupled to the drain of N-type transistor 92 at node 75. The source of N-type transistor 92 is connected to the drain of P-type transistor 54 at node 47. The output of logic inverter 74 is coupled to the drain of N-type transistor 93 which, in turn, is connected to the drain of N-type transistor 93 at node 77. Word-line write inputs 96 and 98 are respectively provided at the gates of N-type transistors 93 and 92.

Gated logic inverters 70 and 72, logic inverters 76 and 74, and N-type transistors 92 and 93 constitute write circuit 61b. Gated logic inverter 70 is coupled to reset delay clock 94 labeled "Clock CIDR"at a clock signal input to gated logic inverter 70. This signal, in turn, is coupled to gated logic inverter 72 at a clock signal input to gated logic inverter 72. At node 75 and node 77, multiple lines can be optionally connected to enable external word operations. Output 46 of skewed random-access memory cell 40 is coupled to the gate of N-type transistor 85 whose drain is tied to ground and whose source is tied to the drain of N-type transistor 87. The gate of N-type transistor 85 is also tied to the gate of N-type transistor 86. Word-line read select inputs 91 and 89 are respectively provided at the gates of N-type transistors 87 and 88. The source of N-type transistor 88 and 87 respectively provides bit-read output data at lines 82 and 80. N-type transistors 87, 85, 86 and 88 constitute read circuit 63b.

Figure 5:
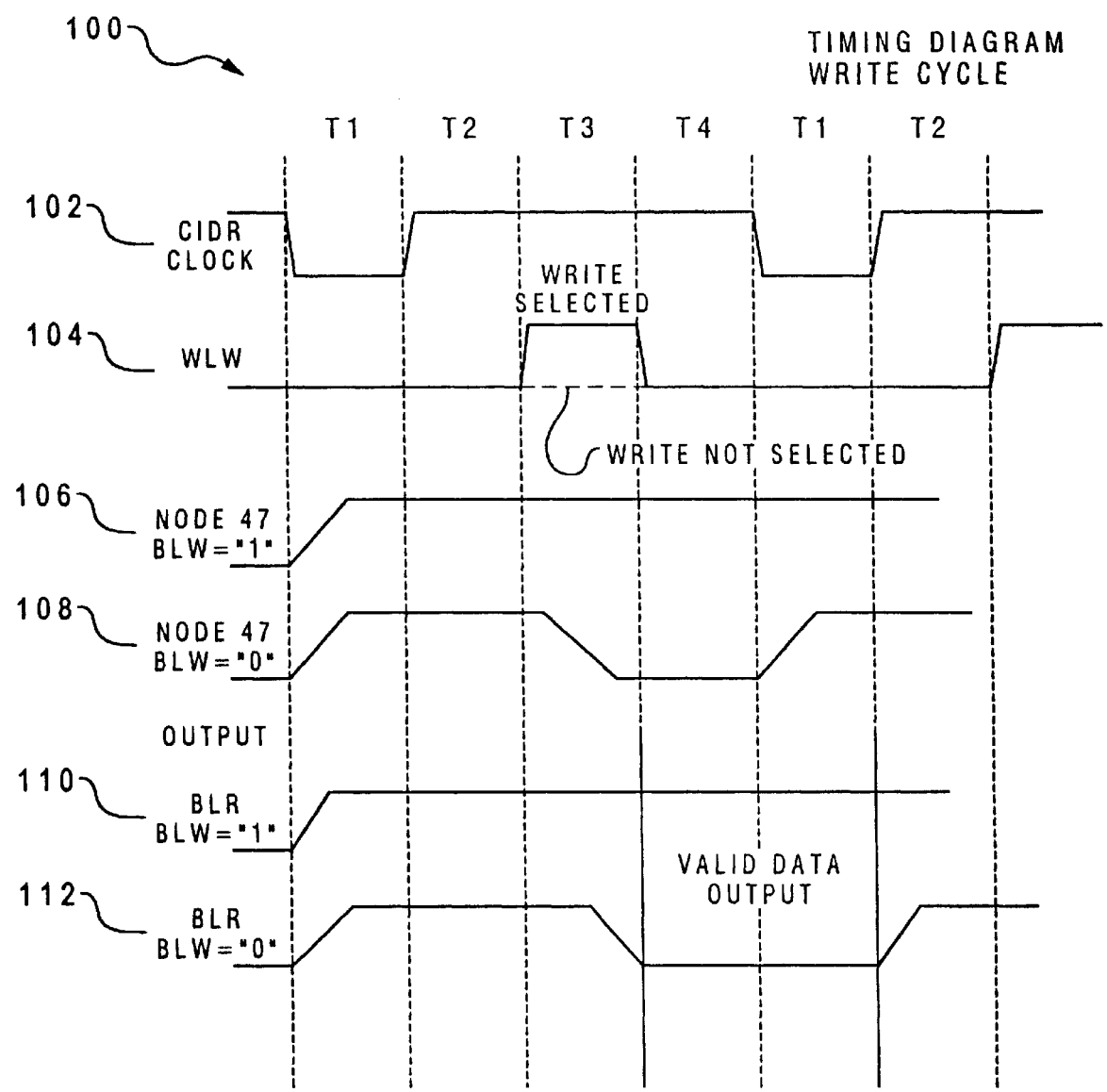
FIG. 5 is a timing diagram illustrative of a write cycle which can be utilized in accordance with the apparatus and method of the present invention.

FIG. 5 depicts a timing diagram 100 having four time intervals T1, T2, T3 and T4 during each clock cycle, and depicts various phases illustrative of a write cycle for random-access memory circuit 49b. CIDR phase 102 is depicted within timing diagram 100. Also depicted within timing diagram 100 are word-line write phase 104, bit line write input phase 106 for a level "1" state at input 47, bit-line write phase 108 for a level "0" at input 47, bit-line read output phase 110 for a level "1" state, and bit-line read output phase 112 for a level "0" state.

Upon the condition of a write access to the memory cell, a clear signal, T1_Cond_Clr, goes low during clock interval T1, so that P-type transistor 54 is turned on during time period T1, charging internal node 47 to a "1" level state. (Signal T1_Cond_Clr is not shown in FIG. 5, however the signal corresponds to signal CIDR shown in FIG. 5, except that T1_Cond_Clr occurs only on the condition of a write access.) Internal node 47 at a "1" state sets the output 46 of skewed random-access memory cell 40 to an opposite "0" level state which corresponds to a data input of "1" at data bit-line write inputs 60 and 62, and to an output level state of "1" at bit-read output lines 80 and 82. An input at data bit-line write input 60 and 62 of a logical "1" produces an output of a logical "1" at bit-read output lines 80 and 82.

Because a logic state level of "1" is implemented at P-type transistor 54 via line 50, the delays from data bit-line write inputs 60 and 62 to the input 45 of skewed randomaccess memory cell 40 are not a factor in the overall write-access time of skewed random-access memory cell 40. This allows skewed random-access memory cell 40 to favor the opposite state, i.e, corresponding to a data bit-line write input state of "0."When data bit-line-write input is at a "0" state, internal node 47 is discharged to ground during time period T3 as determined by one of the inputs: word-line write 96 or wordline write 98. Word-line write 96 and word-line write 98 provide a form of clocking control such that they only go to a positive voltage level during time period T3. During time period T3, a fast negative discharge of internal node 47 is desired. This leads to a valid data output at bit read output lines 80 and 82 at time T4. Bit-read output lines 80 and 82 are preferably fed to the input of another domino logic circuit (not shown), so that multiple logic levels can be connected for computation during the same evaluation clock phase.

Clock CIDR 94 functions as a delay reset clock. Clock CIDR 94 is coupled to gated logic inverter 70 at a clock signal input to gated logic inverter 70. Clock CIDR 94 is positive during time periods T2 and T3. During time period T2, clock CIDR 94 allows the data-input signal at data bit-line write input 60 and 62 to propagate to the source (bottom) of the N-type transistors 92 and 93 whose gates are respectively connected to word-line write inputs 98 and 96. During time period T3, a discharge path for the discharge of input node 47 to ground is provided through N-type transistors 92 and 93.

During time period T4, word-line write inputs 98 and 96 are returned to ground, and N-type transistors 92 and 93 are shut off so that gated logic inverters 70 and 72 and logic inverters 76 and 74 are not disconnected from input 45. Also, during time period T4, the of skewed random-access memory cell 40 is maintained by skewed random-access memory cell 40 itself via a feedback path provided within the lower inverter (i.e., inverter 44) of skewed random-access memory cell 40. Inverter 44 is deliberately chosen to be very weak in its ability to drive a signal. Thus, if P-type transistor 54 is turned on, it will dominate skewed random-access memory cell 40. For example, P-type transistor, when turned on, will drive a logic "1" level into skewed random-access memory cell 40 even if skewed random-access memory cell 40 had previously been set to a "0" condition at input 47. Inverter 42 is preferably a high-performance inverter which provides the fastest possible response to a negative-going write for a "0" state at data bit-line write inputs 60 and 62.

A conflict normally exists in cells such as skewed random-access memory cell 40 where one inverter opposes another inverter during cell-state transition. Such a configuration normally leads to poor performance if the two inverters utilize equal-size devices. In such a case, an unbalanced weak/strong combination of inverters exists. However, in the present invention, such a conflict during cell-state transition does not exist because random-access memory circuit 49b utilizes skewed random-access memory cell 40 for register storage purposes in combination with the aforementioned clocking arrangement to create a fast-write register array. During the time periods when skewed random-access memory cell 40 is being accessed for reading, skewed random-access memory cell 40 remains undisturbed when utilized in conjunction with the clocking scheme of random-access memory circuit 49b.

Thus, skewed random-access memory cell 40 is a form of a General Purpose Register ("GPR"). A GPR is a small, high-speed memory circuit within a microprocessor that is intended to be used for any purpose, or, alternatively, one that is not ordinarily used by the operating system for any specific purpose. The GPR utilized in conjunction with the invention described herein is prevented, by virtue of the circuity provided by the invention, from backward write disturbance by using the aforementioned delay reset clock GPR write data and a quarter phase clock for GPR write enable. Such clock assignments extend the data hold time of the GPR. The longer hold time provided by the present invention insures that a uni-direction write takes place while allow the GPR (e.g., skewed random-access memory cell 40) to be "skewed" in favor of a write path.

While the invention has been particularly shown and described with reference to a preferred embodiment, it will be understood by those skilled in the art that various changes in form and detail may be made therein without departing from the spirit and scope of the invention.

What is claimed is:

1. A random-access memory apparants for rapidly writing high-level logic data to and from said random-access memory apparants during phase-driven timing cycles, comprising:

an unbalanced storage means for the evanescent strorage of binary data, said unbalanced storage means having opposing logic inverters respectively coupled together at a first input node and a second input node, wherein a first logic inverterof said opposing logic inverters is sized larger than a second inverter of said opposing logic inverters such that high-level logic data can be rapidly written to said unbalanced storage means during a write cycle, wherein said first logic inverter comprises a high-performance logic inverter and said second logic inverter comprises a logic inverter weak in its ability to drive a binary logic signal;

read/write means for reading and writing binary data to and form said unbalanced storage means, wherein said read/write means operates in a cycle which includes clock phases carried on a phase line to said read/write means, such that said read/write means comprises:

read means for reading binary data from said unbalanced storage means said read coupled to said unbalanced storage means, wherein said read means comprises at least one series connected transistor circuit;

precharge means for charging an input of said unbalanced storage means to a precharge voltage level, wherein said precharge means includes a precharge transistor having a drain coupled to said input of said unbalanced storage means, a gate coupled to said phase line, and a source coupled to a voltage supply; and write means for writing binary data to said unbalanced storage means, said write means coupled to said unbalanced storage means and to said precharge means at said drain of said precharge means, wherein said write means includes at least on pull-down circuit.

2. The random-access memory apparatus of claim 1 wherein said at least one pull-down circuit includes:

a pull-down transistor coupled to said of precharge transistor, said precharge transistor composed of a P-type transistor, wherein said pull-down transistor comprises an N-type transistor that includes a drain coupled to a an output of a logic inverter;

said logic inverter cooupled to a gated logic inverter at an output of said gated logic inverter;

a delay reset clock coupled to said gated logic inverter at a clock signal input of said gated logic inverter;

a bit-line write input coupled to said gated logic at a logic signal input to said gated logic inverter; and a word-line write input coupled to a gate of said pull-down transistor.

3. The random-access memory apparatus of claim 2 wherein said at least one series connected transistor circuit comprises:

a drain of an upper transistor connected to source of lower transistor wherein said lower transistor includes a gate connected to an output of said unbalanced storage means and a drain coupled to ground, such that said upper transistor and said lower transistor comprises N-type transistor;

a word-line read select input coupled to a gate of said upper transistor; and a bit-line read output provided at a source of said upper transistor.

4. The random-access memory apparatus of claim 3 wherein said at least one pull-down circuit further includes a node located between aid pull-down transistor and said inverter wherein mutliple read/write ports may be coupled.

5. The random-access memory apparatus of claim 4 wherein said cycle which includes clock phases carried on a phase line to said read/write means further includes:

four clock phases carried on a phase line provided by a clock input to said read/write means, wherein said clock input is provided by a system gated clock which can assert a clear signal during a first clock phase of said four clock phases.

6. A method for desiging a random-access memory apparatus which allows high-level logic data to rapidly written to a random-access memory apparatus during phase-driven timing cycles, comprising the steps of:

coupling to an unbalanced storage circuit for the evanescent storage of binary data, a read/write circuit for reading and writing binary data to and from said unbalanced storage circuit;

modifying said unbalanced storage circuit to include opposing logic inferters respectively coupled together at a first input node and a second input node, wherein a first logic inverter of said opposing logic inverters is sized larger than a second logic inverter of said opposing logic inverters sich that high-level logic data can be rapidly written to said inbalanced storage circuit during a write cycle, wherein said first logic inverter comprises a high-performance logic inverter and said second logic inverter comprises a logic inverter weak in its ability to drive a binary logic signal;

connecting a phase line for carrying clock phases to said read/write circuit, such that said that read/write circuit includes:

a read circuit for reading binary data from said unbalanced storage circuit, said read circuit coupled to said unbalanced storage circuit includes a precharge transistor having a drain coupled to said input of said unbalanced storage circuit, a gate coupled to said phase line, and a source coupled to a voltage supply; and write circuit for writing binary data to said inbalanced storage circuit, said write circuit coupled to said inbalanced storage circuit and to said precharge circuit at said drain of said precharge circuit, wherein said write circuit includes at least one pull-down circuit.

7. The method of claim 6 wherein the step of connecting a phase line for carring clock phases to said read/write circuit further comprises the steps of:

configuring said writing circuit to include at least one pull-down circuit, wherein said at least one pull-down circuit includes a pull-down transistor, a logic inverter and a gated logic inverter;

coupling to a drain of said pull-down transistor, an output of said logic inverter;

connecting to an input of said logic inverter, an output of said gated logic inverter;

coupling to said gated logic inverter, a delay reset clock at a clock signal input to said gated logic inverter;

connecting to said gated logic inverter, a bit-line write input at a logic signal input to said gated logic inverter; and coupling a word-line write input to a gate of said pull-down transistor.

8. The method of claim 7 wherein the step of connecting a phase line for carrying clock phases to said read/write circuit further comprises the steps of:

modifying said read circuit to include at least one series connected transsistor circuit wherein said at least one series connected transistor circuit includes an upper transistor and a lower transistor, wherein said upper transistor and said lower transistor each comprise N-type transistors;

coupling a drain of said upper transistor to a source of said lower transistor;

connecting a gate of said lower transistor to an output of said unbalanced storage circuit;

coupling a drain of said lower transistor to ground;

connecting a word-line read select input to a gate of said upper transistor;

providing a bit-line read output provided at a source of said upper transistor; and configuring said precharge transistor as a P-type transistor.

9. The method of claim 8 further comprising the step of;

coupling mutiple read/write ports to a node located between said pull-down transistor and said logic inverter; and configuring said phase line for carrying clock phases to operate in cycle which includes four clock phases carried on said phase line provided by clock input to said circuit for reading and writing binayr data to and from said unbalanced storage circuit, wherein said clock input is provided by a system gated clock which can assert a clear signal during a first clock phase of said four clock phases.

10. A method for rapidly writing high-level logic data to a random-access memory apparatus during phase-driven timing cycles, wherein said random-access memory apparatus includes and inbalanced memory cell having opposing inverters wherein said opposing inverters include a first logic inverter sized larger than a second logic inverter such that high-level logic data can be rapidly written to said unbalanced memory celll during a write cycle, comprising the steps of:

sequentially providng low-level logic state data and high-level logic state data as input to an unbalanced memory cell;

clearing data from said unbalanced memory cell by writing low-level logic state data to said unbalanced memory cell in a time interval prior to a write interval; and initiating a write interval in response to clearing data from said unbalanced memory cell wherein high-level logic data is written to said unbalanced memory cell such that an amount of time of said write interval is minimized due to the presence of said opposing inverters within said inbalanced memory cell.

11. The method of claim 10 wherein the step of sequentially providing low-level logic state data and high-level logic state data a input to an inbalanced memory cell, further comprises the step of:

sequentially providing low-level logic state data and high-level logic state dat as input to an unbalanced memory cell, such that said first logic inverter comprises a high-level performance logic inverter and said second logic inverter comprises a logic inverter weak in tis ability to drive a binary logic signal.

12. The method of claim 11 further comprising the step of:

connecting a phase line for carrying clock phases to a read/write circuit for reading abd writing binary data to and from said unbalanced memory cell, such that said read/write circuit incudes:

a precharge circuit for charging an input of siad unbalanced memory cell to a precharge voltage level, wherein said precharge circuit includes a precharge transistor having a drain coupled to said input of said unbalanced memory cell and to a write circuit, a gate coupled to said phase line, and a source coupled to a voltage supply;

said write circuit, coupled to said unbalanced memory cell and to said precharge circuit, for writng binary data to said unbalanced memory cell, wherein said write circuit includes at least one pull-down circuit; and a read circuit, coupled to said unbalanced memory cell, for reading binary data from said unbalanced memory cell, wherein said read circuit comprises at least one series connected transistor circuit.

13. An apparatus for rapidly writing high-level logic datra to a random-access memory during phase-driven timing cycles, wherein said random-access memory includes an unbalanced memory cell having opposing inverters wherein said opposing inverters include a first logic inverter iszed larger than a second logic inverter such that high-level logic data can be rapidly written to said unbalanced memory cell during a write cycle, said apparatus comprising:

means for sequentially providing low-level logic state data and high-level logic state data as input to an unbalanced memory cell;

means for clearing data from said unbalanced memory cell by writing low-level logic state data to said unbalanced memory cell in a time interval prior to a write interval; and means for initiating a write interval in response to clearing data from said unbalanced memory cell wherein high-level logic data is written to sid unbalanced memory cell such that an amount of time of said write interval is minimized due to the presence of said opposing inverters within said unbalanced memory cell.

14. The apparatus of claim 13 wherein said means for sequentially providing low-level logic state data and high-level logic state data as input to an unbalanced memory cell, further comprises:

means for sequentially providing low-level logic state data and high-level logic state data as input to and unbalanced memory cell, such that said first logic inverter comprises a high-performance logic inverter and said second logic inverter comprises a logic inverter weak in its ability to drive a binary logic signal.

15. The apparatus of claim 14 further comprising a phase line for carrying clock phases coupled to a read/write circuit for reading and writing binary data to and from said unbalanced memory cll, wherein said read/write circuit comprises:

a precharge circuit for charging an input of said unbalanced memory cell to a precharge voltage level, wherein said precharge circuit includes a precharge transistor having a drain coupled to said input of said unbalanced memory cell and to a write circuit, a gate coupled to said phase line, and a source coupled to a voltage supply;

said write circuit, coupled to said unbalanced memory cell and to said precharge circuit, for writing binary data to said unbalanced memory cell, wherein said write circuit includes at least one pull-down circuit; and read circuit, coupled to said unbalanced memory cell, for reading binary data from said unbalanced memory cell, wherein said read circuit comprises at least one series connected transistor circuit.

16. A random-access memory apparatus for rapidly writing high-level logic data to and from said random-access memory apparatus during phase-drivem timing cycles, comprising:

an unbalanced storage means for the evanescent storage of binary data, said unbalanced storage means having opposing logic inverters respectively coupled together at a first input node and a second input node, wherein a first logic inverter of said opposing logic inverters is sized larger than second inverter of said opposing logic inverters such that high-level logic data can be rapidly written to said unbalanced storage means during a write cycle, wherein said first logic inverter comprises a high-performance logic inverter and said second logic inverter comprises a logic inverter weak in its ability to drive a binary logic signal;

read/write means for reading and writing binary data to and from said unbalanced storage means, wherein said read/write means operates in cycles which includes clock phases carried on a phase line to said read/write means, such that said read/write means comprises:

read means fokr reading binary data from said unbalanced storage means, said read means coupled to said unbalanced storage means, wherein said read means comprises at least one series connected transistor circuit;

precharge means for charging an input of said unbalanced storage means to a precharge voltage level, wherein said precharge means includes a precharge transistor having a drain coupled to said input of said unbalanced storage means, gate coupled to said phase line, and a source coupled to a voltage supply; and write means for writing binary data to said unbalanced storage means, said write means couple to said unbalanced storage means and to said precharge means at said drain of said precharge means, wherein said write means includes at least one pull-down circuit; and wherein said at least one pull-down circuit includes:

a pull-down transistor coupled to said drain of said precharge transistor, wherein said pull-down transistor includes a drain coupled to an output of a logic inverter;

said logic inverter coupled to a gated logic inverter at an output of said gated logic inverter;

a delay reset clock coupled to said gated inverter at a clock signal input of said gated logic inverter;

a bit-line write input coupled to said gated logic inverter at a logic signal input to said gated logic inverter; and a word-line write input coupled to a gate of said pull-down transistor.

17. A random-access memory apparatus for rapidly writing high-level logic data to and from said random-access memory apparatus during phase-driven timing cycles, comprising:

an unbalanced storage means for the evanescent storage of binary data, said unbalanced storage means having opposing logic inverters respectively coupled together at a first input node and a scond input node, wherein a first logic inverter of said opposing logic inverters is sized larger than a second inverter of said opposing logic inverters such that high-level logic data can be rapidly written to said unbalanced storage means during a write cycle, wherein said first logic inverter comprises a high-performance logic inverter and said second logic inverter comprises a logic inverter weak in its ability to drive a binary logic signal;

read/write means for reading and writing binary data to and from said unbalanced storage means, wherein said read/write operates in a cycle which includes clock phases carried on a phase line to said read/write means, such that said read/write means comprises:
   read means for reading binary data from said unbalanced storage means, said read means coupled to said unbalanced storage means, wherein said read means comprises at least on series connected transistor circuit;
   precharge means for charging an input of said unbalanced storage means to a precharge voltage level, wherein said precharge means includes a precharge tansistor having a drain coupled to said input of said unbalanced storage means, a gate coupled to said phase line, and a source coupled to a voltage supply; and
   write means for writing binary data to said unbalanced storage means, said write means coupled to said unbalanced storage means and to said precharge means at said drain of said precharge means, wherein said write means includes at least one pull-down circuit;
said at least one pull-down circuit comprising:
   a pull-down transistor coupled to said drain of said precharge transistor, wherein said pull-dwon transistor includes a drain coupled to an output of a logic inverter;
   said logic inverter coupled to a gated logic inverter at an output of said gated logic inverter;
   a delay reset clock coupled to said gated logic inverter at a clock signal input of said gated logic inverter;
   a bit-line write input coupled to said gatedlogic invertr at a logic signal input to said gated logic inverter; and
   a word-line write input coupled to gate of said pull-down transistor;
said at least one series connected transistor circuit comprising:
   a drain of an upper transnistor coupled to a source of a lower transistor wherein said lower transistor includes a gate connected to an output of said unbalanced storage means and a drain coupled tok ground;
   a word-line read select input coupled to gated of said upper transistor; and
   a bit-line read output provided at a source of said upper transistor.

18. A random-access memory apparatus for rapidly writing high-level logic data to and from said random-access memory apparatus during phase-driven timing cycles, comprising:
   an unbalanced storage means for the evanescent storage of binary data, said unbalanced storage means having opposing logic inverters respectively coupled togather at a first input node and a second input node, wherein a first logic inverter of said opposing logic inverters is sized larger than a second invertr of said opposing logic inverters such that high-level logic data can be rapidly written to said unbalanced storage means during a write cycle, wherein said first logic inverter comprises a high-performance logic invertr and said second logic inverter comprises a logic inverter weak in its ability to drive a binary logic signal;
   read/write means for reading and writing binary data to and from said unbalanced storage means, wherein said read/write means operates in a cycle which includes clock phases carried on a phse line said read/write means, such that said read/write means comprises:
      read means for reading for binary data from said unbalanced storage means, said read means coupled to said unbalanced storage means, wherein said read means comprises at least one series connected transistor circuit;
      precharge means for charging an input fo said unbalanced storage means to precharge voltage level, wherein said precharge means includes a precharge transistor having a drain coupled to said input of said unbalanced storage means, a gate coupled to said phase line, and a source coupled to a voltage supply; and
      write means for writing binary data to said unbalanced storage means, said write means coupled to said unbalanced storage means and to said precharge means at said drain of said precharge means, wherein write means includes at least one pull-down circuit;
   said at least one pull-down circuit comprising:
      a pull-down transistor comprising an N-type transistor coupled to said drain of said precharge transistor, wherein said precharge transistor comprises a P-type transistor, such that said pull-down transistor includes a drain coupled to an output of a logic inverter;
      said logic inverter coupled to gated logic inverter at an output of said gated logic inverter;
      a delay reset clock coupled to said gated logic inverter at a clock signal input of said gated logic inverter;
      a bit-line write input coupled to said gated logic inverter at a logic signal input to said logic inverter; and
      a word-line write input coupled to a gate of said pull-down transistor;
   said at least one series connected transistor circuit comprising:
      a drain of an upper transistor coupled to a source of a lower transistor wherein said lower transistor includes a gate connected to an output of said unbalanced storage means and a drain coupled to ground, such that said upper transistor and said low transistor comprise N-type transistor;
      a word-line read select input coupled to a gate of said upper transistor; and
      a bit-line read output provided at a source of said upper transistor.

19. A method for designing a random-access memory apparatus which allows high-level logic data to be rapidly written to a random-access memory apparatus during phase-driven timing cycles, comprising the steps of:
   coupling to an unbalanced storage circuit for the evencscent storage of binary data, a read/write circuit for reading and writing binary data to and from said unbalanced storage circuit;
   modifying said unbalanced storage circuit to include opposing logic inverters respectively coupled together at a first input node and a second input node, wherein a first logic inverter of said opposing logic inverters is sized larger than a second logic inverter of said opposing logic inverters such that high-level logic data can be rapidly written to said unbalanced storage circuit during a write cycle, wherein said first logic inverter comprises a high-performance logic inverter and said second logic inverter comprises a logic inverter weak in its ability to drive a binary logic signal;
   connecting a phase line for carrying clock phases to said read/write circuit, such that said read/write circuit includes:
      read circuit for reading binary data from said unbalanced storage circuit, said read circuit coupled to said unbalanced storage circuit, wherein said read circuit comprises at least one series connected transistor circuit;

precharge circuit for charging an input of said unbalanced storage circuit to a precharge voltage level, wherein said precharge circuit includes a precharge transistor having a drain coupled to said input of said inbalanced storage circuit, a gate coupled to said phase line, and source coupled to a voltage supply; and write circuit for writing binary data to said unbalanced storage circuit, said write circuit coupled to said unbalanced storage circuit and to said precharge circuit at said drain of said precharge circuit, wherein said write circuit includes at least one pull-down circuit;

configuring said write circuit to include at least one pull-down circuit, wherein said at least one pull-down circuit includes a pull-down transistor, a logic invertr and a gated logic inverter;

coupling to a drain of said pull-down transistor, an output of said logic invertr;

connecting to an input fo said logic invertr, an output of said logic invreter;

coupling to said gated logic inverter, a delay reset clock signal input to said gated logic inverter;

connecting to said gated logic inverter, a bit-line write input at a logic signal input to saoid gated logic inverter; and coupling a word-line write input to a gate of said pull-down transistor.

20. A method for designing a random-access memory apparatus which allows high-level logic data to be rapidly written to a random-access memory apparatus during phase-driven timing cycles, comprising the steps of:

coupling to an unbalanced storage circuit for the evanescent storage of binary data, a read/write circuit for reading and writing bianry data to and from said unbalanced storage circuit;

modifying said unbalanced storage circuit to include opposing logic inverters respectively coupled together at a first input node and a second input node, wherein a first logic inverter of said opposing logic inverters is sized larger tha a second logic inverter of said opposing logic inverters such that high-level logic data can be rapidly written to said unbalanced storage circuit during a write cycle, wherein said first logic inverter comprises a high-performance logic inverter and said second logic invnerter comprises a logic inverter weak in its ability to drive a binary logic signal;

connecting a phase line for carrying clock phases to said read/write circuit, such that said read/write circuit includes:

read circuit for reading binary data from said unbalanced storage circuit, said read circuit coupled to said unbalanced storage circuit, wherein said read circuit comprises at least one series connected transistor circuit;

precharge circuit for charging an input of said unbalanced storage circuit to a precharge voltage level, wherein saif precharge circuit includes a precharge transistor having a drain coupled to said input of said unbalanced storage circuit, a gate coupled to said phase line, and a source coupled to a voltage supply; and write circuit for writing binary data to said unbalanced storage circuit, said write circuit coupled to said unbalanced storage circut and to said precharge circuit at said drain of said precharge circuit, wherein said write circuit at least one pull-down circuit;

configuring said write circuit to include at least one pull-down circuit, wherein said at least one pull-down circuit includes a pull-down transistor, a logic invertr and a gated logic inverter;

coupling to a drain of said pull-down transistor, an output of said logic inverter;

connecting to an input of said logic inverter, an output of said gated logic inverter;

coupling to said gated logic inverter, a delay reset clock at a clock signal input to said gated logic inverter;

connecting to said gated logic inverter, a bit-line write input at a logic signal input to said gated logic inverter;

coupling a word-line write input to a gate of said pull-down transistor;

configuring said read circuit to include at least one series connected transistor circuit wherein said at least one series connected transistor circuit includes an upper transistor and a lower transistor, whererin said upper transistor and said lower transistor eahc comprise N-type transistors;

coupling a drain of said upper transistor to a source of said lower transistor;

connecting a gate of said lower transistor to an output of said unbalanced storage circuit;

coupling a drain of said lower transistor to ground;

connecting a word-line read select input to a gate of said upper transistor; and configuring said precharge transistor as a P-type transistor.

21. A method for designing a random-access memory apparatus which allows high-level logic data to be rapidly written to a random-access memory apparatus during phase-driven timing cycles, comprising the steps of:

coupling to an unbalanced storage circuit for the evanescent storage of binary data, a read/write circuit for reading and writing binary data to and from said unbalanced storage circuit;

modifying said unbalanced storage circuit to incude opposing logic inverters respectively coupled together at a first input node and a second input node, wherein a first logic inverter of said opposing logic inverters is sized larger than a second logic inverter of said opposing logic inverters such that high-level logic data can be rapidly written to said unbalanced storage circuit during write cycle, wherein said first logic invertr comprises a high-performance logic inverter and said second logic invertr comprises a logic inverter weak in its ability to drive a binary logic signal;

connecting a phase line for carrying clock phases to said read/write circuit, such that said read/write circuit includes:

read circuit for reading binary data from said unbalanced storage circuit, said read circuit coupled to said unbalanced storage circuit, wherein said read circuit comprises at least one series connected transistor circuit;

precharge circuti for charging an input of said unbalanced storage circuit to a precharge voltage level, wherein said precharge circuit includes a precharge transistor having a drain coupled to said input of said unbalanced storage circuit, a gate coupled to said phase line, and source coupled to voltage supply; and write circuit for writing binary data to said unbalanced storage circuit, said write circuit coupled to said unbalanced storage circuit and to said precharge circuit at said drain of said precharge circuit, wherein said write circuit includes at least one pull-down circuit;

configuring said write circuit to include at least one pull-down circuit, wherein said at least one pull-down circuit includes a pull-down transistor, a logic inverter and gated logic inverter;

coupling to a drain of said pull-down transistor, an output of said logic inverter;

connecting to an input of said logic inverter, an output of said gated logic inverter;

coupling to said gated logic inverter, a delay reset clock at a clock signal input to said gated logic inverter;

connecting to said gated logic inverter, a bit-line write input at a logic signal input to said gated logic inverter;

coupling a word-line write input to a gate of said pull-down transistor;

configuring said read circuit to include at least one series connected transistor circuit wherein said at least one series connected transistor circuit includes an upper transistor and a lower transistor, wherein said upper transistor and said lower transistor each comprise N-type transistors;

coupling a drain of said upper transistor to a source of said lower transistor;

connecting a gate of said lower transistor to an output of said unbalanced storage circuit;

coupling a drain of said lower transistor to ground;

connecting a word-line read select input tok a gate of said upper transistor;

providing a bit-line read output provided at a source of said upper transistor;

configuring said precharge transistor as a P-type transistor;

coupling multiple read/write ports to a node located between said pull-down transistor and said logic inverter; and configuring said phase line for carrying clock phases to operate in a cycle which includes four clock phases carried on said phase line provided by a clock input to said circuit for reading and writing binary data to and from said unbalanced storage circuit, wherein said clock input is provided by a system gated clock which can assert a clear signal during a first clock phase of said four clock phases.

* * * * *

UNITED STATES PATENT AND TRADEMARK OFFICE
CERTIFICATE OF CORRECTION

PATENT NO. : 5,901,079
DATED : May 4, 1999
INVENTOR(S) : Chiu et al.

It is certified that error appears in the above-identified patent and that said Letters Patent is hereby corrected as shown below:

Title page,
Item [57], ABSTRACT,
Line 2, please delete the second occurrence of "and";
Line 3, please delete the first word "from".

Column 1,
Line 33, please change "wellknown" to -- well-known --.

Column 2,
Line 42, please change "integratedcircuit" to -- integrated-circuit --;
Lines 50-51, please change "cellac-cess" to -- cell-access --;
Line 56, please change "phasedriven" to -- phase-driven --.

Column 5,
Line 24, please change "randomacess" to -- random-access --;
Line 58, please change "randomaccess" to -- random-access --.

Column 6,
Line 48, please change "randomaccess" to -- random-access --.

Column 7,
Between lines 57 and 58, please insert the following two paragraphs:
-- Ordinarily, in prior-art or conventional memory cells, balanced inverters are utilized to form a memory cell because the time required to write data to the memory cell is constant regardless of whether high-level logic data such as "1" or low-level logic data such as a "0" is being written. Thus, it can be seen from the foregoing discussion that the present invention utilizes unbalanced inverters such that high-level logic data such as a "1" can be written much faster to skewed random-access memory cell 40 than low-level logic data such as a "0." To take advantage of this speed improvement, which is principally limited to high-level logic data such as a "1," it is necessary to make sure that, during a write cycle or write interval, it is unnecessary to write a "0."
    Therefore, in response to realizing that a write operation can be performed, skewed random-access memory cell 40, which is the same operation as writing a "0" to skewed random-access memory cell 40. Such an operation is performed during an interval prior to the write interval. There is not enough time to spare for such an operation in the write interval where timing is critical. Thus, if a "0" is the data to be written to skewed random access memory cell 40 during the write interval, no time is required to write this data because it has already been written to skewed random-access memory cell 40 during the interval before the write interval. If a "1" is the data to be written, the "1" can be written to skewed random-access memory cell 40 faster than would be ordinarily the case in a conventional memory cell because of the presence within the conventional memory cell of conventional balanced inverters. --

UNITED STATES PATENT AND TRADEMARK OFFICE
CERTIFICATE OF CORRECTION

PATENT NO.   : 5,901,079
DATED        : May 4, 1999
INVENTOR(S)  : Chiu et al.

It is certified that error appears in the above-identified patent and that said Letters Patent is hereby corrected as shown below:

Column 7,
Lines 64 and 66, please delete "apparants" and insert -- apparatus --.

Column 8,
Line 5, please delete "inverterof" and insert -- inverter of --;
Line 14, please delete "form" and insert -- from --;
Line 19, please delete "means said read" and insert -- means, said read means --;
Line 37, please delete "said of precharge" and insert -- said drain of said precharge --;
Line 42, please change "cooupled" to -- coupled --;
Line 54, please delete "to source of lower" and insert -- to a source of a lower --;
Line 59, please change "transistor" to -- transistors --;
Line 66, please change "aid" to -- said --.

Column 9,
Line 10, please insert -- be -- between "to" and "rapidly";
Line 23, please change "inbalanced" to -- unbalanced --;
Line 29, please delete the second occurrence of "that";
Line 33, following "said unbalanced storage circuit" and before "includes a precharge", please insert:
        -- , wherein said read circuit comprises at least one
            series connected transistor circuit;
     precharge circuit for charging an input of said unbalanced
            storage circuit to a precharge voltage level, wherein
            said precharge circuit --
Line 40, please change "inbalanced" to -- unbalanced --.

Column 10,
Line 21, please insert -- a -- after "in" and before "cycle";
Line 23, please insert -- a -- after "by" and before "clock";
Line 24, please change "binayr" to -- binary --.
Line 31, please change "and inbalanced" to -- an unbalanced --;
Line 35, please change "celll" to -- cell;
Line 50, please change "inbalanced" to -- unbalanced --;
Line 53, please change "a" to -- as --;
Line 56, please change "dat" to -- data --;
Line 60, please change "tis" to -- its --;
Line 63, please change "abd" to -- and --;
Line 65, please change "incudes:" to -- includes: --;
Line 66, please change "siad" to -- said --.

UNITED STATES PATENT AND TRADEMARK OFFICE
CERTIFICATE OF CORRECTION

PATENT NO.   : 5,901,079
DATED        : May 4, 1999
INVENTOR(S)  : Chiu et al.

It is certified that error appears in the above-identified patent and that said Letters Patent is hereby corrected as shown below:

Column 11,
Line 14, please change "datra" to -- data --;
Line 18, please change "iszed" to -- sized --;
Line 31, please change "sid" to -- said --;
Line 39, please change "and" to -- an --;
Line 60, please insert -- a -- before "read".

Column 12,
Line 6, please insert -- a -- between "than" and "second";
Line 15, please delete "cycles" and insert -- a cycle --;
Line 18, please change "fokr" to -- for --;
Line 31, please delete "couple" and insert -- coupled --.

Column 13,
Line 7, please change "on" to -- one --;
Line 11, please change "tansistor" to -- transistor --;
Line 30, please delete "gatedlogic invertr" and insert -- gated logic inverter --;
Line 36, please change "transnistor" to -- transistor --;
Line 39, please change "tok" to -- to --;
Line 41, please change "gated" to -- gate --;
Line 51, please change "togather" to -- together --;
Lines 54 and 58, please change "invertr" to -- inverter --;
Line 64, please change "phse" to -- phase --.

Column 14,
Line 4, please change "fo" to -- of --;
Line 5, please insert -- a -- between "to" and "precharge";
Line 39, please change "transistor" (second occurrence) to -- transistors --;
Lines 48-49, please delete "evenc-scent" and insert -- evanescent --.

Column 15,
Line 8, please change "inbalanced" to -- unbalanced --; and insert a space between "circuit," and "a";
Line 10, change "tosaid" to -- to said --;
Lines 18 and 21, please change "invertr" to -- inverter --;
Line 22, please change "fo" to -- of -- and change "invertr" to -- inverter --;
Line 23, please change "invreter" to -- invreter --;
Line 27, please change "saoid" to -- said --;
Line 38, please change "bianry" to -- binary --;
Line 44, please change "tha" to -- than --;
Line 49, please change "invnerter" to -- inverter --;
Line 61, please change "saif" to -- said --.

UNITED STATES PATENT AND TRADEMARK OFFICE
CERTIFICATE OF CORRECTION

PATENT NO.    : 5,901,079
DATED         : May 4, 1999
INVENTOR(S)   : Chiu et al.

It is certified that error appears in the above-identified patent and that said Letters Patent is hereby corrected as shown below:

Column 16,
Line 1, please change "circut" to -- circuit --;
Line 3, please insert -- includes -- between "circuit" and "at";
Line 6, please change "invertr" to -- inverter --;
Line 22, please change "whererin" to -- wherein --;
Line 23, please change "eahc" to -- each --;
Line 31, please delete "and" and add the following text:
    -- providing a bit-line read output provided at source of
        said upper transistor; and --
Line 43, please change "incude" to -- include --;
Line 50, please insert -- a -- before "write" and change "invertr" to -- inverter --;
Line 52, please change "invertr" to -- inverter --;
Line 62, please change "circuti" to -- circuit --;
Line 67, please insert -- a -- between "to" and "voltage".

Column 17,
Line 10, please insert -- a -- before "gated".

Column 18,
Line 7, please change "tok" to -- to --.

Signed and Sealed this

Fifteenth Day of April, 2003

JAMES E. ROGAN
*Director of the United States Patent and Trademark Office*